United States Patent
Moyal et al.

(10) Patent No.: US 6,239,632 B1
(45) Date of Patent: May 29, 2001

(54) METHOD, ARCHITECTURE AND/OR CIRCUITRY FOR CONTROLLING THE PULSE WIDTH IN A PHASE AND/OR FREQUENCY DETECTOR

(75) Inventors: Nathan Y. Moyal; Bertrand J. Williams, both of Austin; Mark Marlett, Georgetown; Steve Meyers, Round Rock, all of TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/398,936

(22) Filed: Sep. 17, 1999

(51) Int. Cl.[7] .......................................... H03L 7/00

(52) U.S. Cl. ........................................... 327/153; 327/154

(58) Field of Search ..................... 327/154, 148, 327/157, 150, 159, 156, 147, 153; 331/17

(56) References Cited

U.S. PATENT DOCUMENTS

| | | | |
|---|---|---|---|
| 4,875,108 | * 10/1989 | Minuhin et al. | 360/51 |
| 5,805,002 | 9/1998 | Ruetz | 327/159 |
| 5,950,115 | * 9/1999 | Momtaz et al. | 455/73 |
| 6,011,822 | * 1/2000 | Dreyer | 375/376 |

* cited by examiner

*Primary Examiner*—Kenneth B. Wells
*Assistant Examiner*—Hiep Nguyen
(74) *Attorney, Agent, or Firm*—Christopher P. Maiorana, P.C.

(57) ABSTRACT

An apparatus comprising a first circuit and a second circuit. The first circuit may be configured to generate (i) a first signal and a second signal in response to a pump down signal and (ii) a third signal and a fourth signal in response to (i) a pump up signal. The second circuit may be configured to generate (a) a first control signal in response to (i) the first signal and (ii) the third signal and (b) a second control signal in response to (i) the second signal and (ii) the fourth signal.

20 Claims, 10 Drawing Sheets

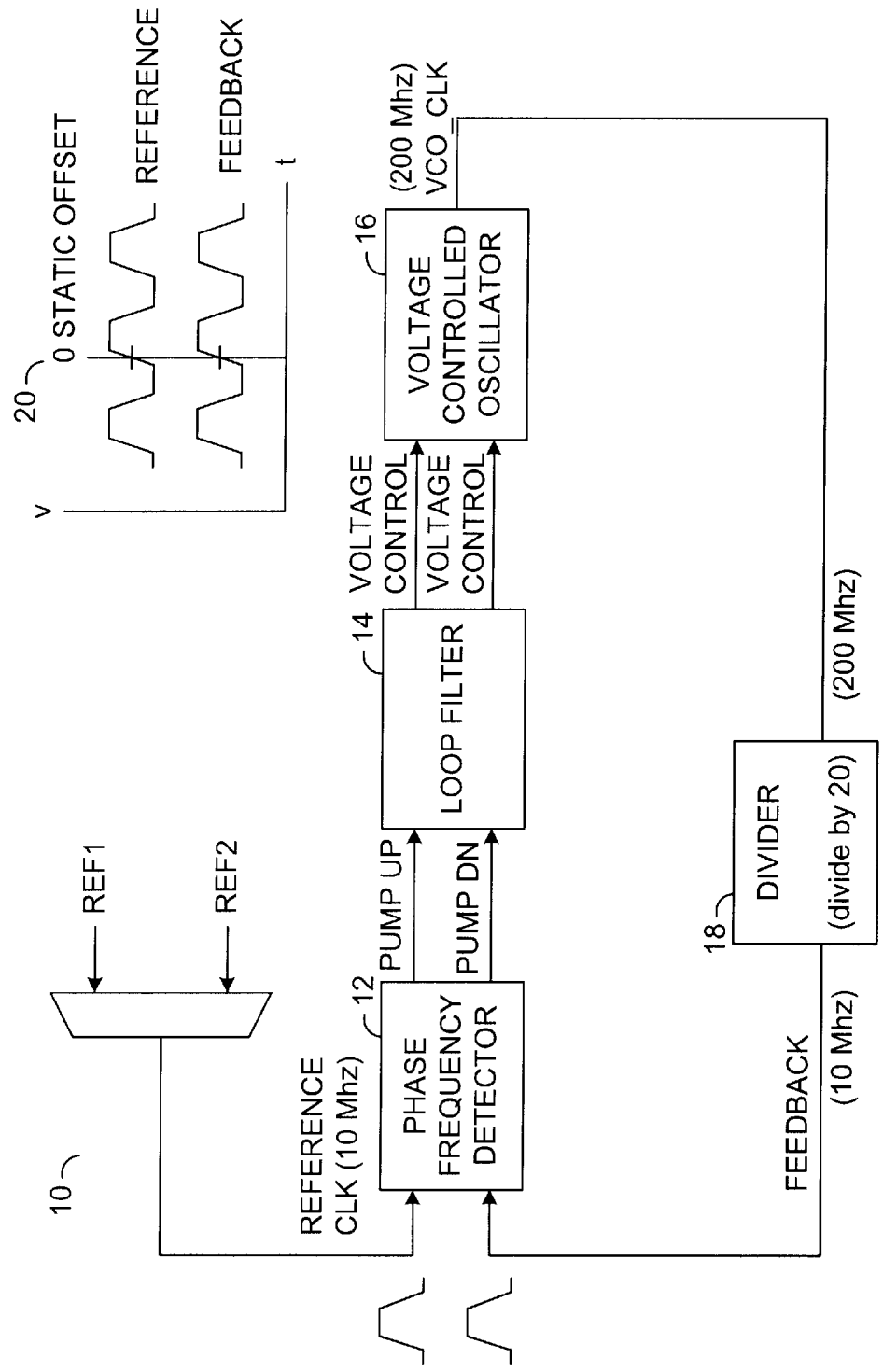
FIG. 1
(CONVENTIONAL)

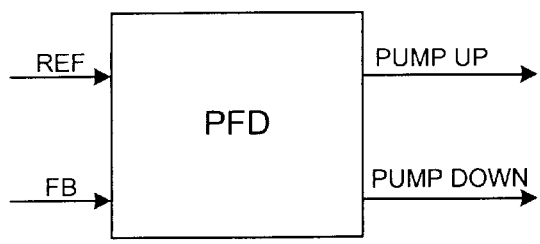
FALLING EDGE OF PUMP UP IS
ALIGNED WITH PUMP DOWN
PUMP SIGNAL FED INTO THE
FILTER CAUSING THE FILTER
NODE TO INCREASE. THIS
DRIVES THE VCO TO RUN
FASTER. FB RISING EDGE
MOVES LEFT.
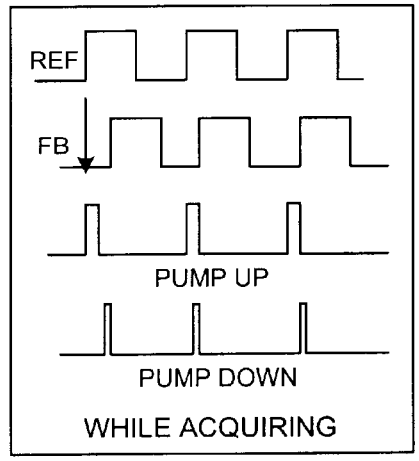
WHILE ACQUIRING
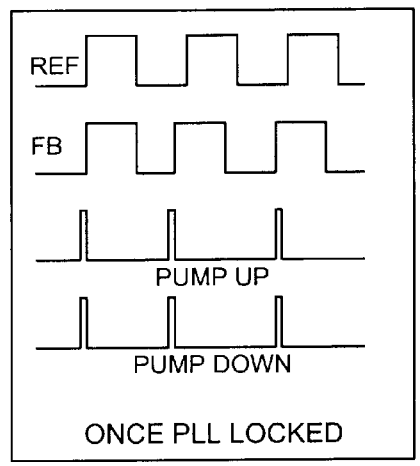
ONCE PLL LOCKED
FIG. 2
(CONVENTIONAL)

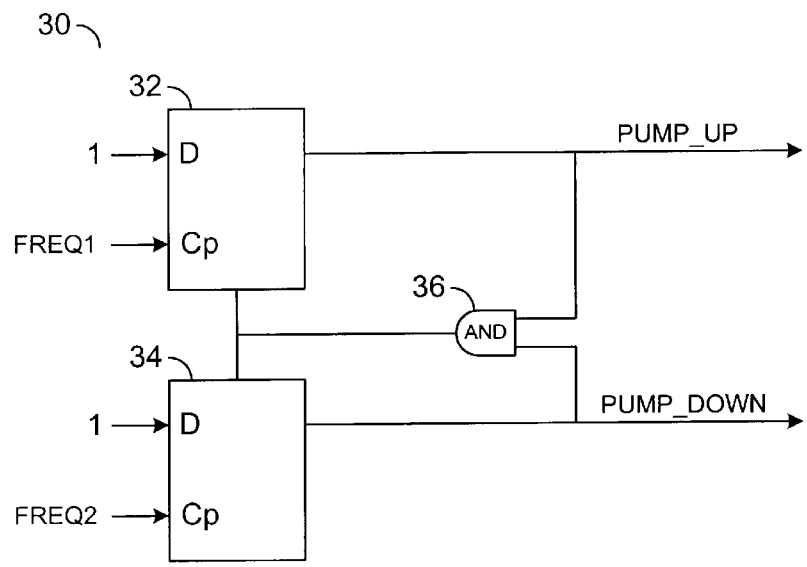
FIG. 3
(CONVENTIONAL)
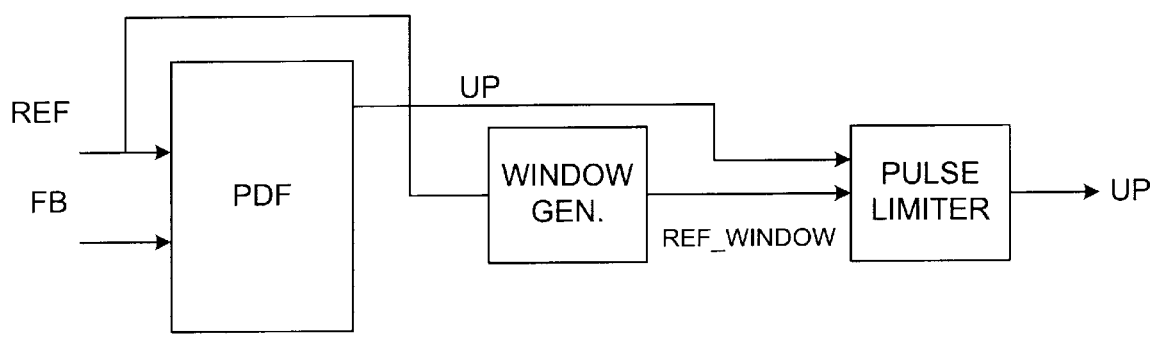
FIG. 4
(CONVENTIONAL)

METHOD, ARCHITECTURE AND/OR CIRCUITRY FOR CONTROLLING THE PULSE WIDTH IN A PHASE AND/OR FREQUENCY DETECTOR

CROSS-REFERENCE TO RELATED APPLICATIONS

The present invention may relate to co-pending application U.S. Ser. No. 09/398,956, filed Sep. 17, 1999, which is hereby incorporated by reference in its entirety.

FIELD OF THE INVENTION

The present invention relates to phase and/or frequency detectors generally and, more particularly, to a method, architecture and/or circuitry for controlling the pulse width in a phase and/or frequency detector.

BACKGROUND OF THE INVENTION

Phase Lock Loops (PLLs) are generally considered clock multipliers. For example, an input reference clock having a frequency of 10 Mhz can be multiplied by the PLL to yield an output clock signal having a frequency of 200 Mhz. Ideally, this clock multiplication would result in an output clock that is in perfect phase/frequency with the reference clock. A phase frequency detector (PFD) is used to generate the proper frequency.

FIG. 1 illustrates a conventional phase lock loop circuit 10. The circuit 10 has a phase frequency detector (PFD) 12, a charge pump/loop filter 14, a voltage controlled oscillator (VCO) 16 and a divider 18. The VCO 16 presents a signal to the divider 18. The divider 18 presents a feedback signal to the PFD 12. The PFD 12 also receives a reference clock signal CLK. The PFD generates pump signals that are proportional to the frequency and phase difference between the reference clock and the feedback signal. The pump signals are presented to the charge pump/loop filter 14. The charge pump/loop filter 14 presents two voltage control signals to the VCO 16 in response to the pump signals. The VCO 16 generates clock signals that are proportional to the voltage control signals. During normal operating conditions, the reference clock is generally synchronized with the feedback signal. Such a synchronization is shown by the block 20.

The acquisition rate of a PLL refers to the rate (MHz/$\mu$S) that a PLL can acquire lock when switching from a first frequency (e.g., A) to a second frequency (e.g., B). When frequency A is equal to frequency B, the acquisition rate refers to the rate of phase re-acquisition. A typical PLL will lose lock when switching from the reference frequency A to the reference frequency B. When the PLL loses lock, the output frequency can jump. A jump in frequency can cause problems in systems that are attached to the PLL.

Applications of PLLs in modern computers may require switching between reference clocks that are at about the same frequency and have some random phase difference. In order to minimize frequency jumps when switching between such reference clocks, the acquisition rate should be as low as possible.

Referring to FIG. 2, timing diagrams illustrating the pump signals of a conventional PFD are shown. The acquisition rate is controlled by the pump signals from the PFD. During lock (REF freq=FB freq and phase) the PFD output will generate a pump up signal and a pump down signal that are minimum but equal in size (internal PFD reset). During the acquisition period (FB trying to lock to REF), one pump signal (i.e., pump down) will be minimal in size, while the other pump signal (i.e., pump up) will be large (proportional to the phase difference). The larger the pump signal, the greater the change in frequency of the VCO.

Referring to FIG. 3, a detailed block diagram illustrating a conventional PFD 30 is shown. Typically two separate clocks (i.e., a clock signal FREQ1 and a clock signal FREQ2) are fed into the PFD 30. The PFD generates PUMP_UP and PUMP_DOWN signals that are proportional to the phase and frequency differences of the incoming clocks. The PFD pump signals have identical falling edges, while the rising edge is a function of the phase difference between the signals FREQ1 and FREQ2. A rising transition of the signal FREQ1 clocks flip-flop 32 making the signal PUMP_UP HIGH. A rising transition of the signal FREQ2 clocks the flip-flop 34 making the signal PUMP_DOWN HIGH. When the signal PUMP_UP and the signal PUMP_DOWN are both HIGH, the AND gate 36 resets the flip-flops 32 and 34, returning both the signal PUMP_UP and the signal PUMP_DOWN to a LOW state. Altering one pump pulse width generally requires altering the other pump pulse width. Reducing large pulse widths can also cause reduction in the reset path.

Referring to FIG. 4, a block diagram illustrating a summary of a conventional method for adjusting the PFD pulse widths is shown. The signal REF is used to generate a reference window signal REF_WINDOW. A pulse limiter circuit truncates any portion of the pump signal that is outside the reference window signal REF_WINDOW. The size of the signal REF_WINDOW is a function of the REF_FREQUENCY. Overlap between the pump signal and the delayed reference window can impact the quality of the pump signal. The delay of the signal REF to the output must match the entire path through the PFD, which consumes excess current. The amount of truncation is a function of the delay path of the signal REF, the width of the signal REF_WINDOW, and the pump path through the PFD. The alignment of the signal REF_WINDOW created relative to the pump signals is difficult to control since it is function of the delay. Implementation requires a larger die area. Placing an extra load on the signal REF can impact the timing of the signal REF that can result in increased static phase offset.

SUMMARY OF THE INVENTION

The present invention concerns an apparatus comprising a first circuit and a second circuit. The first circuit may be configured to generate (i) a first signal and a second signal in response to a pump down signal and (ii) a third signal and a fourth signal in response to a pump up signal. The second circuit may be configured to generate (a) a first control signal in response to (i) the first signal and (ii) the third signal and (b) a second control signal in response to (i) the second signal and (ii) the fourth signal.

The objects, features and advantages of the present invention include providing an apparatus that may (i) control pump signal pulse widths without relying on reference and/or feedback signals, (ii) control pump signal pulse width without an external pulse generator or PFD modification, (iii) truncate PFD pulses independent of input frequency, (iv) track internal PFD reset signals in determining amount of pulse truncation, (v) truncate pulses independently of matching for the critical signal path, (vi) allow digital control of the amount of pulse truncation, (vii) control pump signals independently of PFD functionality, (viii) provide pulse truncation that is self disabling when PLL is locked, (ix) controls pulse width without a decision circuit, (x) use less current and/or (xi) require less die area than conventional method.

BRIEF DESCRIPTION OF THE DRAWINGS

These and other objects, features and advantages of the present invention will be apparent from the following detailed description and the appended claims and drawings in which:

FIG. 1 is a block diagram of a half-rate clock phase detector;

FIG. 2 is a timing diagram illustrating the pulse timing of a conventional phase frequency detector;

FIG. 3 is a circuit diagram of a conventional phase frequency detector;

FIG. 4 is a block diagram of a conventional circuit for limiting the pulse width of a phase frequency detector;

DETAILED DESCRIPTION OF THE PREFERRED EMBODIMENTS

Figure 5:
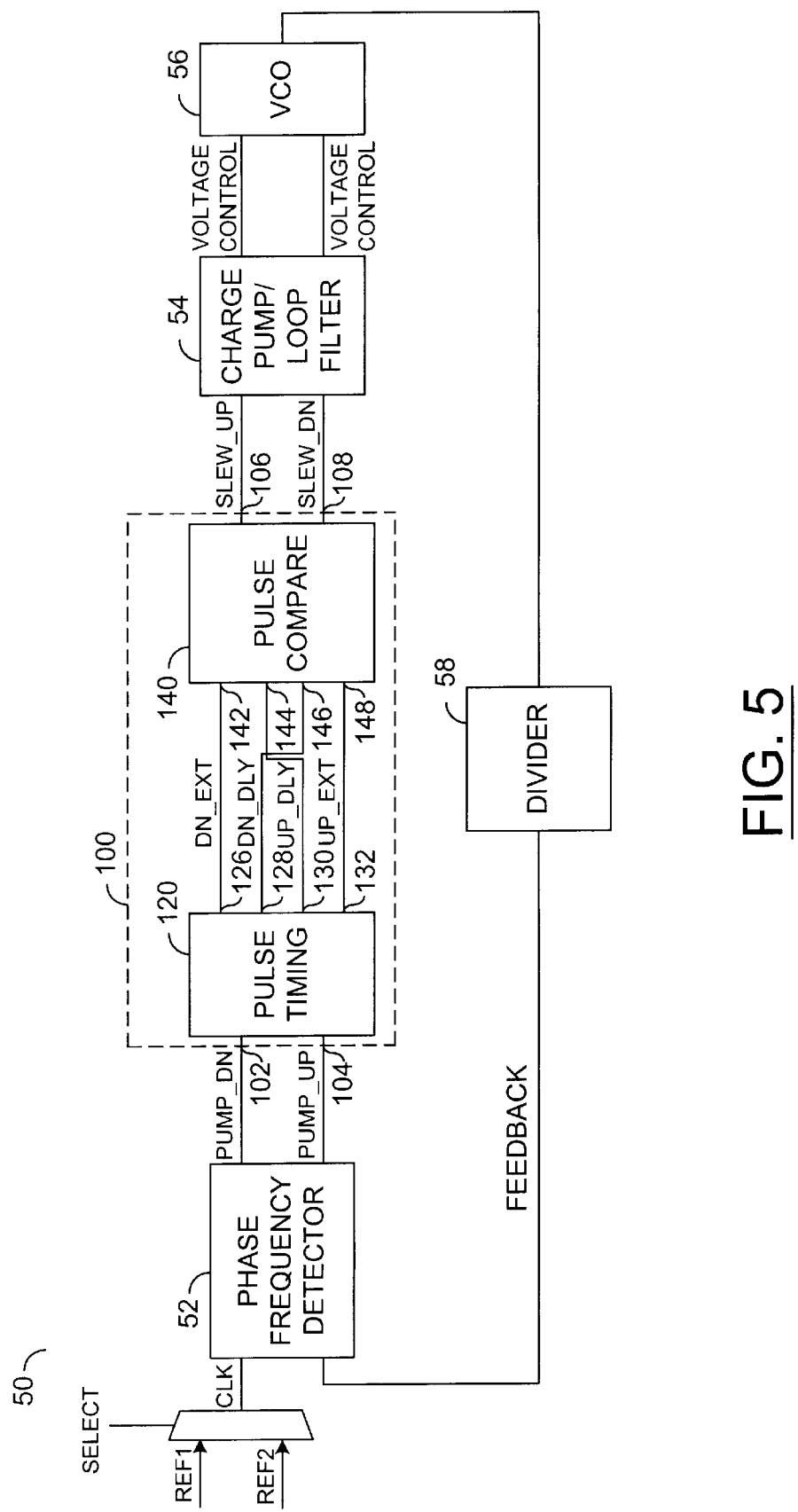
FIG. 5 is a block diagram of a preferred embodiment of the present invention.

Referring to FIG. 5, a block diagram of a circuit 100 illustrating a preferred embodiment of the present invention is shown. The circuit 100 may be implemented, in one example, as a pulse width limiting circuit. The circuit 100 is shown implemented in the context of a phase lock loop (PLL) 50. The circuit 100 may receive pump signals from a phase frequency detector (PFD) 52. The circuit 100 may present control signals to a charge pump/loop filter 54. The circuit 100 may have an input 102, an input 104, an output 106, and an output 108. A first input signal (e.g., PUMP_DN) may be received at the input 102. A second input signal (e.g., PUMP_UP) may be received at the input 104. The circuit 100 may be configured to generate a first output signal (e.g., SLEW_UP) at the output 106 and a second output signal (e.g., SLEW_DN) at the output 108. The signal SLEW_UP and the signal SLEW_DN may be pump signals and may be presented to the charge pump/loop filter 54.

The circuit 100 generally comprises a circuit 120 and a circuit 140. The circuit 120 may be implemented as, in one example, a pulse timing circuit. The circuit 140 may be implemented as, in one example, a pulse compare circuit. The circuit 120 may have an output 126, an output 128, an output 130, and an output 132. The circuit 120 may receive the signal PUMP_DN from the input 102 and the signal PUMP_UP from the input 104. The circuit 120 may be configured to generate a first signal (e.g., DN_EXT) at the output 126, a second signal (e.g., DN_DLY) at the output 128, a third signal (e.g., UP_DLY) at the output 130, and a fourth signal (e.g., UP_EXT) at the output 132.

The circuit 140 may have an input 142, an input 144, an input 146 and an input 148. The signal DN_EXT may be received at the input 142. The signal UP_DLY may be received at the input 144. The signal DN_DLY may be received at the input 146. The signal UP_EXT may be received at the input 148. The circuit 140 may be configured to generate the signal SLEW_UP in response to (i) the signal DN_EXT and (ii) the signal UP_DLY. The circuit 140 may be configured to generate the signal SLEW_DN in response to (i) the signal UP_EXT and (ii) the signal DN_DLY.

The circuit 100 may prevent wide pulse widths received from the PFD 52 from reaching the charge pump/loop filter 54. During a lock condition, the PFD 52 may generate small reset pulses. When an out of lock condition occurs (e.g., during acquisition), the PFD 52 may generate pulses relative to the phase and/or frequency differences of a clock signal (e.g.,CLK) and a feedback signal (e.g., FEEDBACK). The circuit 100 generally truncates pump pulses that are larger than a reference pulse width so that the pulses are generally equal to the pulse width of the reference pulse. When the signals PUMP_DN and PUMP_UP are already small (e.g., during the lock condition), the signals SLEW_UP and SLEW_DN may have no pulse width modification.

The circuit 100 generally determines whether pulse width modification is needed by comparing an extended pulse width of one pump signal (e.g., the signals DN_EXT or UP_EXT) to the delayed, un-stretched pulse width of the other pump signal (e.g., the signals UP_DLY or DN_DLY). The smaller of the pulse widths is selected as the slew signal (e.g., SLEW_UP or SLEW_DN). There are three general cases for the generation of the signals SLEW_UP and SLEW_DN:

1. During PLL acquisition—A small pump signal (e.g., DN_DLY or UP_DLY) is compared to an already large and extended pulse width (e.g., DN_EXT or UP_EXT) to yield small slew signal (e.g., SLEW_UP or SLEW_DN). In such a condition, no pulse limiting takes place.
2. During PLL acquisition—A large pump signal (e.g., DN_DLY or UP_DLY) is compared to a small extended pulse width (e.g., DN_EXT or UP_EXT) to yield small extended slew signal (e.g., SLEW_UP or SLEW_DN). In such a condition, pulse limiting may be engaged.
3. During PLL lock—A small pump signal (e.g., DN_DLY or UP_DLY) is compared to a small extended pulse width (e.g., DN_EXT or UP_EXT) to yield small slew signal (e.g., SLEW_UP or SLEW_DN). In such a condition, no pulse limiting takes place.

The circuit 100 will generally generate only small slew signals SLEW_UP and SLEW_DN. Once the PLL is locked, the circuit 100 generally acts as a buffer with no pulse truncation. The lack of pulse truncation during a lock condition generally allows the PLL to behave as a linear PLL.

Figure 6:
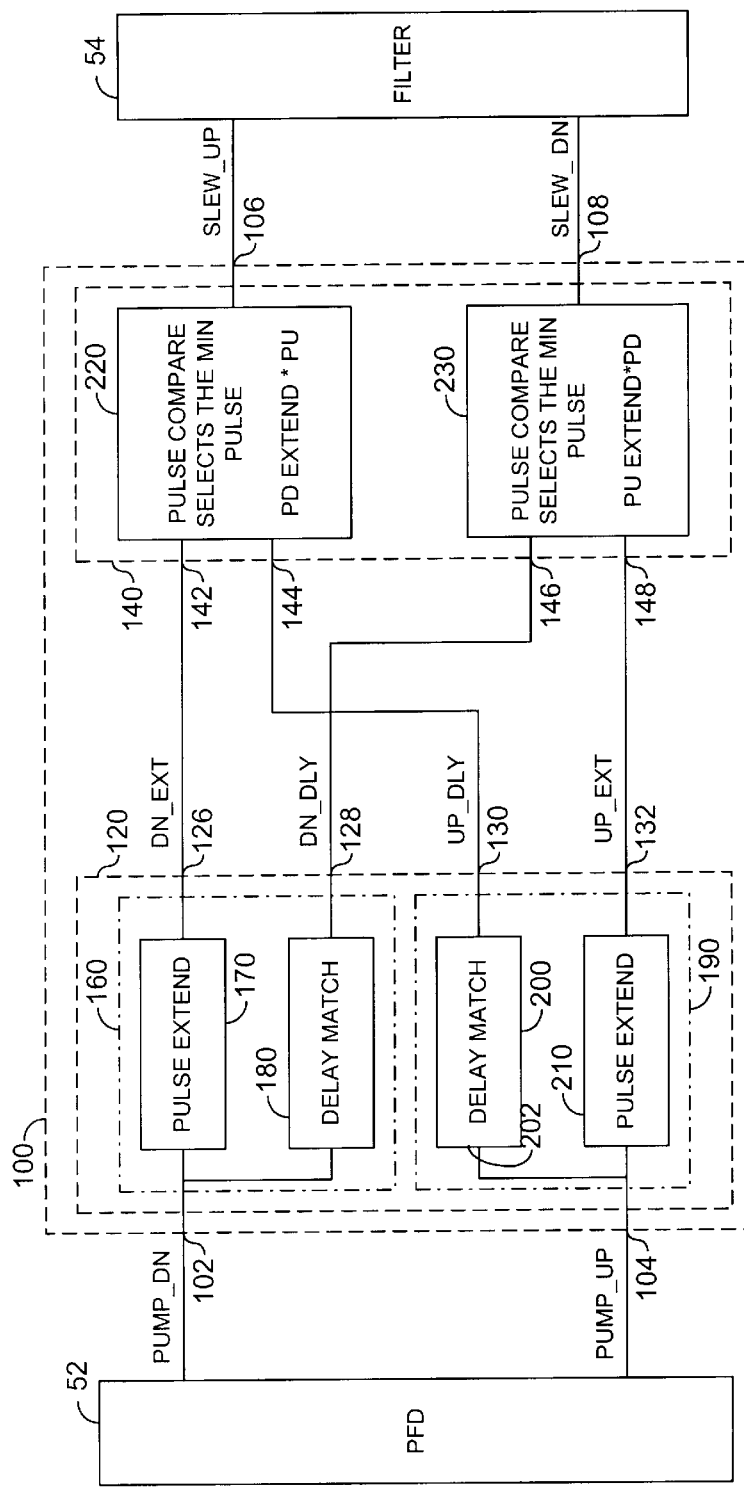
FIG. 6 is a detailed block diagram of a preferred embodiment of the present invention.
Figure 6:
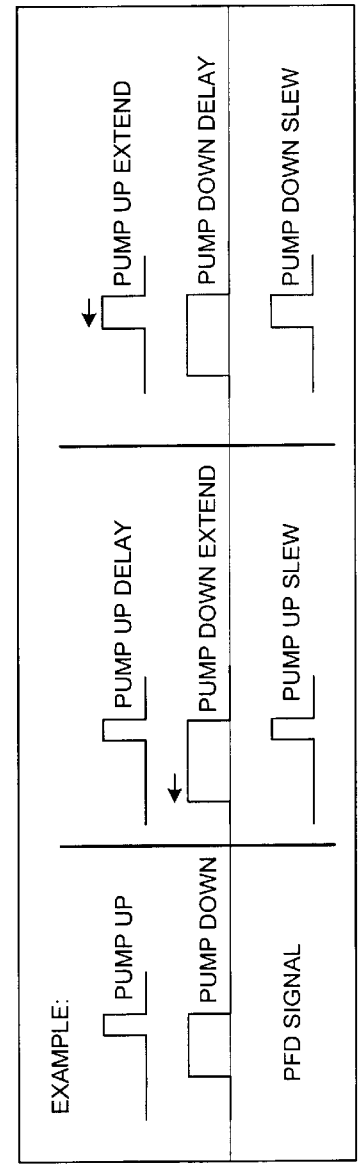

Referring to FIG. 6, a more detailed block diagram of the circuit 100 is shown. The circuit 120 generally comprises a circuit 160 and a circuit 190. The circuit 160 generally receives the signal PUMP_DN from the input 102. The circuit 160 may be configured to generate (i) the signal DN_EXT and (ii) the signal DN_DLY in response to the signal PUMP_DN.

The circuit 160 generally comprises a circuit 170 and a circuit 180. The circuit 170 may be, in one example, a pulse extender circuit. The circuit 180 may be, in one example a delay matching circuit. The circuit 170 may be configured to generate the signal DN_EXT in response to the signal PUMP_DN. The circuit 180 may be configured to generate the signal DN_DLY in response to the signal PUMP_DN.

The circuit 190 may be configured to generate (i) the signal UP_DLY and (ii) the signal UP_EXT in response to the signal PUMP_UP. The circuit 190 generally comprise a circuit 200 and a circuit 210. The circuit 200 may be, in one example, a delay matching circuit. The circuit 210 may be, in one example, a pulse extender circuit. The circuit 200 may be configured to generate the signal UP_DLY in response to the signal PUMP_UP. The circuit 210 may be configured to generate the signal UP_EXT in response to the signal PUMP_UP.

The circuit 140 generally comprises a circuit 220 and a circuit 230. The circuit 220 may be implemented, in one example, as a pulse selector circuit. The circuit 230 may be implemented, in one example, as a pulse selector circuit. The circuit 220 may be configured to generate the signal SLEW_UP in response to (i) the signal DN_EXT and (ii) the signal UP_DLY. The circuit 230 may be configured to generate the signal SLEW_DN in response to (i) the signal DN_DLY and (ii) the signal UP_EXT.

Figure 7:
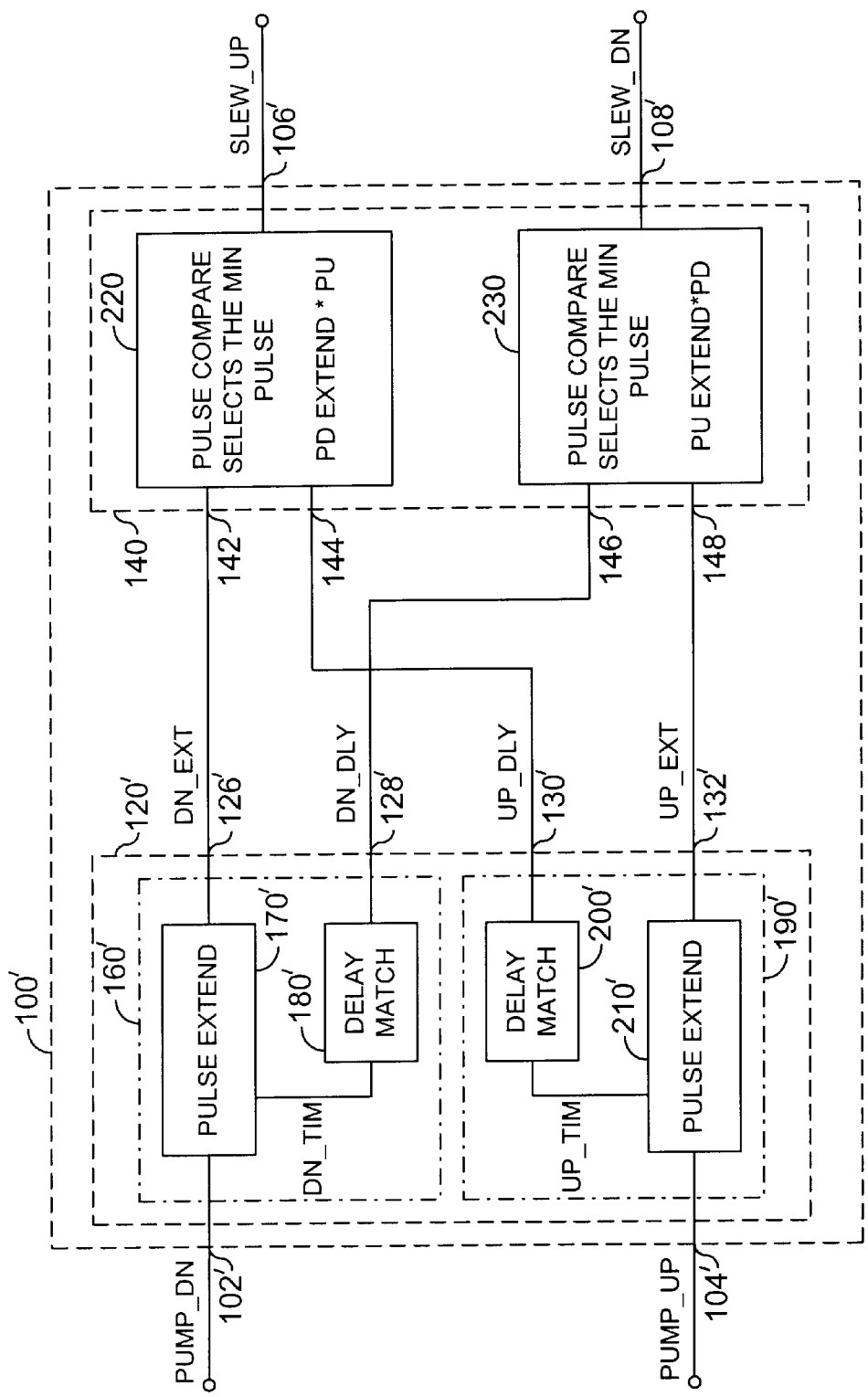
FIG. 7 is a detailed block diagram of an alternative implementation of the present invention.

Referring to FIG. 7, a block diagram of a circuit 100' illustrating an alternative implementation of the present invention is shown. The circuit 100' shares some of the delay matching with the pulse extender circuit. The circuit 100' differs from the circuit 100 in the implementation of a pulse timing circuit 120'. The pulse timing circuit 120' generally comprises a circuit 160' and a circuit 190'. The circuit 160' generally comprises a circuit 170' and a circuit 180'. The circuit 170' may be configured to present a time delayed version of the signal PUMP_DN (e.g., DN_TIM) to the circuit 180'. The circuit 170' may be configured to generate the signal DN_EXT in response to the signal PUMP_DN. The circuit 180' may be configured to generate the signal DN_DLY in response to the signal DN_TIM.

The circuit 190' generally comprises a circuit 200' and a circuit 210'. The circuit 210' may be configured to present a time delayed version of the signal PUMP_UP (e.g., UP_TIM) to the circuit 200'. The circuit 210' may be configured to generate the signal UP_EXT in response to the signal PUMP_UP. The circuit 200' may be configured to generate the signal UP_DLY in response to the signal UP_TIM. The remainder of the circuit 100' is generally similar to the circuit 100.

Figure 8:
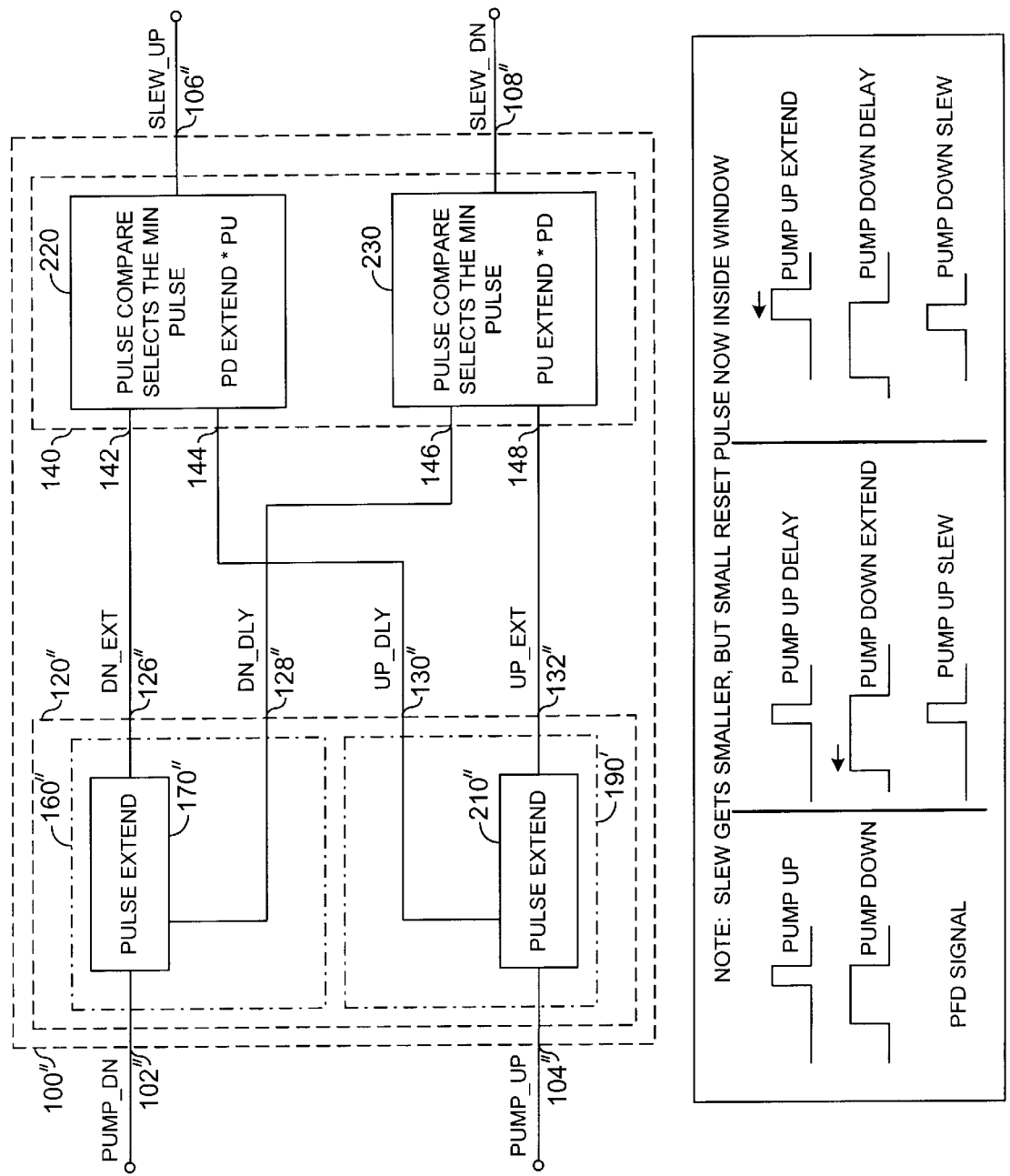
FIG. 8 is a detailed block diagram of another alternative implementation of the present invention.

Referring to FIG. 8, a block diagram of a circuit 100" illustrating another alternative implementation of the present invention is shown. In the circuit 100", some or all of the delay matching may be eliminated to ensure that the signal DN_DLY or the signal UP_DLY will be within the extended pulse window and not on an edge. The circuit 100" differs from the circuit 100' in the implementation of an alternative pulse timing circuit 120". The circuit 120" comprises a circuit 170" and a circuit 210". The circuit 170" may be configured to generate (i) the signal DN_DLY and (ii) the signal DN_EXT in response to the signal PUMP_DN. The circuit 210" may be configured to generate (i) the signal UP_DLY and (ii) the signal UP_EXT in response to the signal PUMP_UP. The remainder of the circuit 100" is generally similar to the circuit 100.

Figure 9:
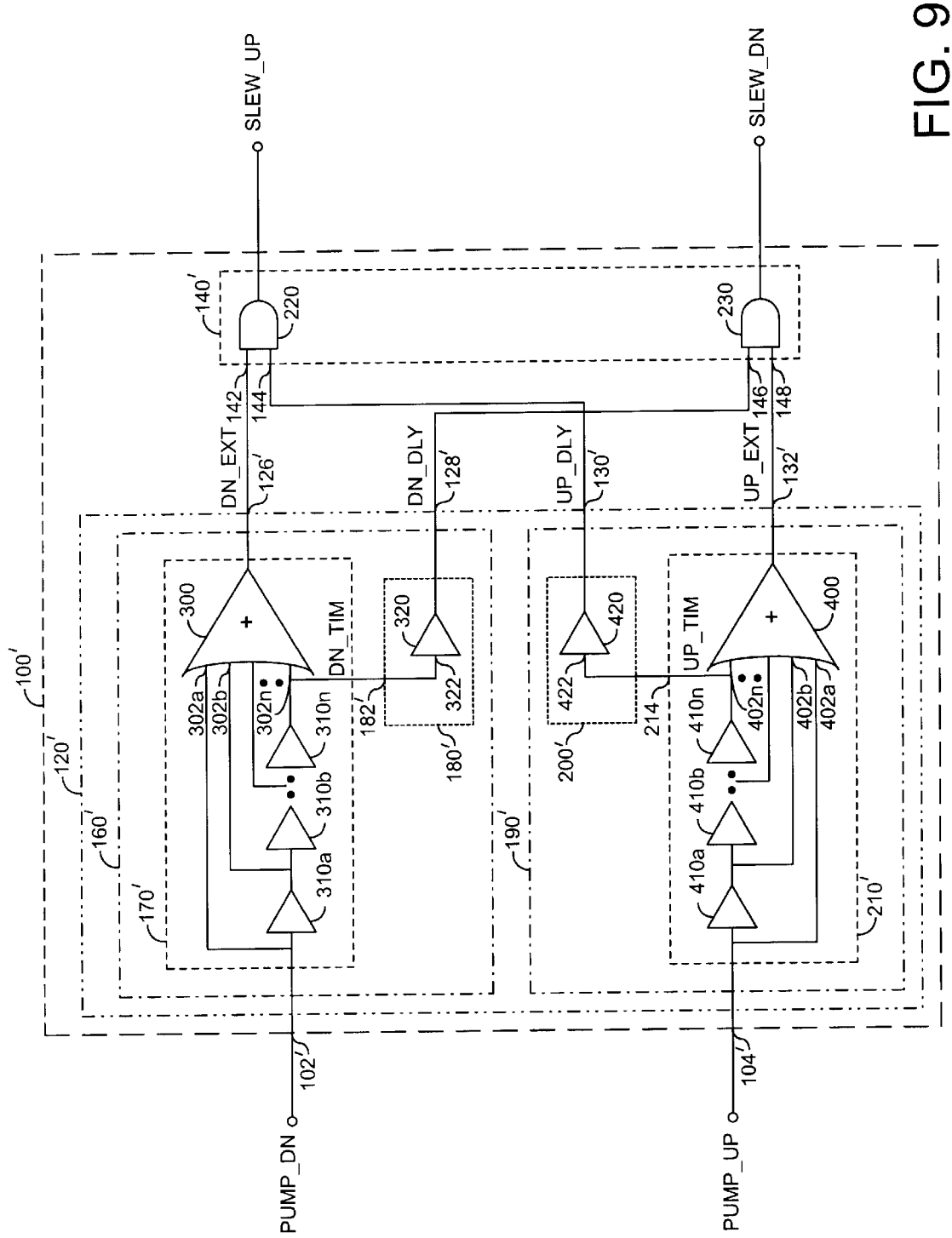
FIG. 9 is a detailed diagram illustrating components of the implementation of FIG. 7.

Referring to FIG. 9, a detailed circuit diagram illustrating an implementation of the circuit 100' is shown. The circuit 170' generally comprises a gate 300 and a plurality of gates 310a–310n. The gate 300 may have a plurality of inputs 302a–302n. The gate 300 may be implemented, in one example, as an N-input OR gate, where N is an integer. However, other types of gates may be implemented accordingly to meet the design criteria of a particular application. The plurality of gates 310a–310n may be implemented, in one example, as non-inverting buffers. However, other types of gates may be implemented accordingly to meet the design criteria of a particular application.

The signal PUMP_DN is generally received at the input 302a. The plurality of gates 310a–310n are generally connected in series. The signal PUMP_DN is generally presented to an input of the gate 310a. An output of each gate of the plurality of gates 310a–310n is generally connected to one of the plurality of inputs 302b–302n. The gate 310n may be configured to generate the signal DN_TIM. The gate 300 may present the signal DN_EXT.

The circuit 180' generally comprises a gate 320. The gate 320 may be implemented, in one example, as a non-inverting buffer. However, other types of gates may be implemented accordingly to meet the design criteria of a particular application. The gate 320 may be configured to generate the signal DN_DLY in response to the signal DN_TIM.

The circuit 200' generally comprises a gate 420. The gate 420 may be implemented, in one example, as a non-inverting buffer. However, other types of gates may be implemented accordingly to meet the design criteria of a particular application. The gate 420 may be configured to generate the signal UP_DLY in response to the signal UP_TIM.

The circuit 210' generally comprises a gate 400, and a plurality of gates 410a–410n. The gate 400 may have a plurality of inputs 402a–402n. The gate 400 may be implemented, in one example, as an N-input OR gate, where N is an integer. However, other types of gates may be implemented accordingly to meet the design criteria of a particular application. The plurality of gates 410a–410n may be implemented, in one example, as non-inverting buffers. However, other types of gates may be implemented accordingly to meet the design criteria of a particular application. The signal PUMP_UP is generally received at the input 402a. The plurality of gates 410a–410n are generally connected in series. The signal PUMP_UP is generally presented to an input of the gate 410a. An output of each gate of the plurality of gates 410a–410n is generally connected to one of the plurality of inputs 402b–402n. The gate 410n may be configured to generate the signal UP_TIM. The gate 400 may present the signal UP_EXT.

The circuits 220 and 230 may be implemented, in one example, as AND gates. However, other implementations may be made accordingly to meet the design criteria of a particular application. The gate 220 generally presents the signal SLEW_UP. The gate 230 generally presents the signal SLEW_DN.

Figure 10:
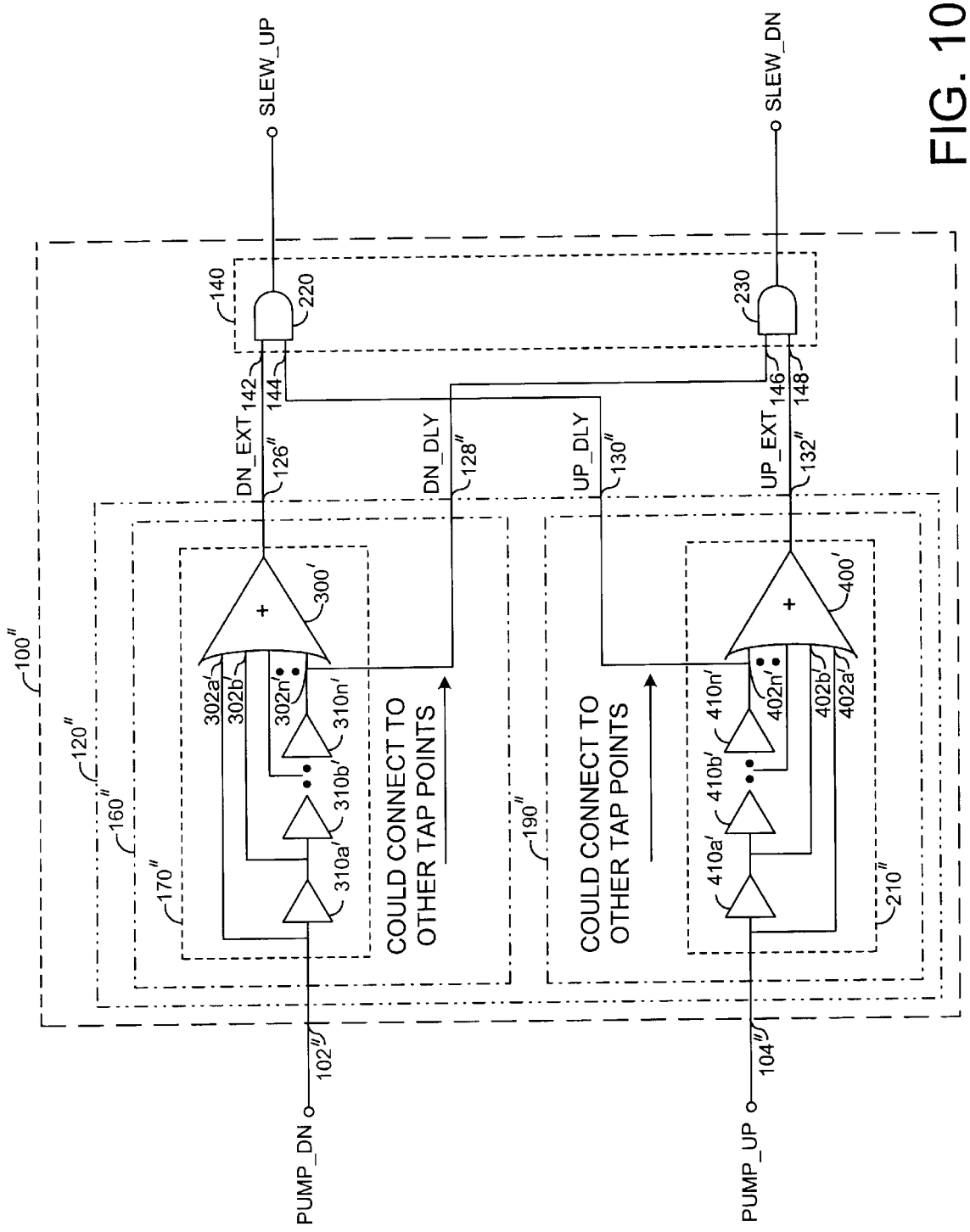
FIG. 10 is detailed diagram illustrating components according to the implementation of FIG. 8.

Referring to FIG. 10, a circuit diagram illustrating an implementation of the circuit 100" is shown. The circuit 100" may be connected similarly to the circuit 100' except that the circuit 180' and the circuit 200' may be eliminated. The circuit 170" may be configured to generate the signal DN_DLY. The signal DN_DLY may be generated by one of a plurality of gates 310a'–310n'. The circuit 210" may be configured to generate the signal UP_DLY. The signal UP_DLY may be generated by one of a plurality of gates 410a'–410n'.

Figure 11:
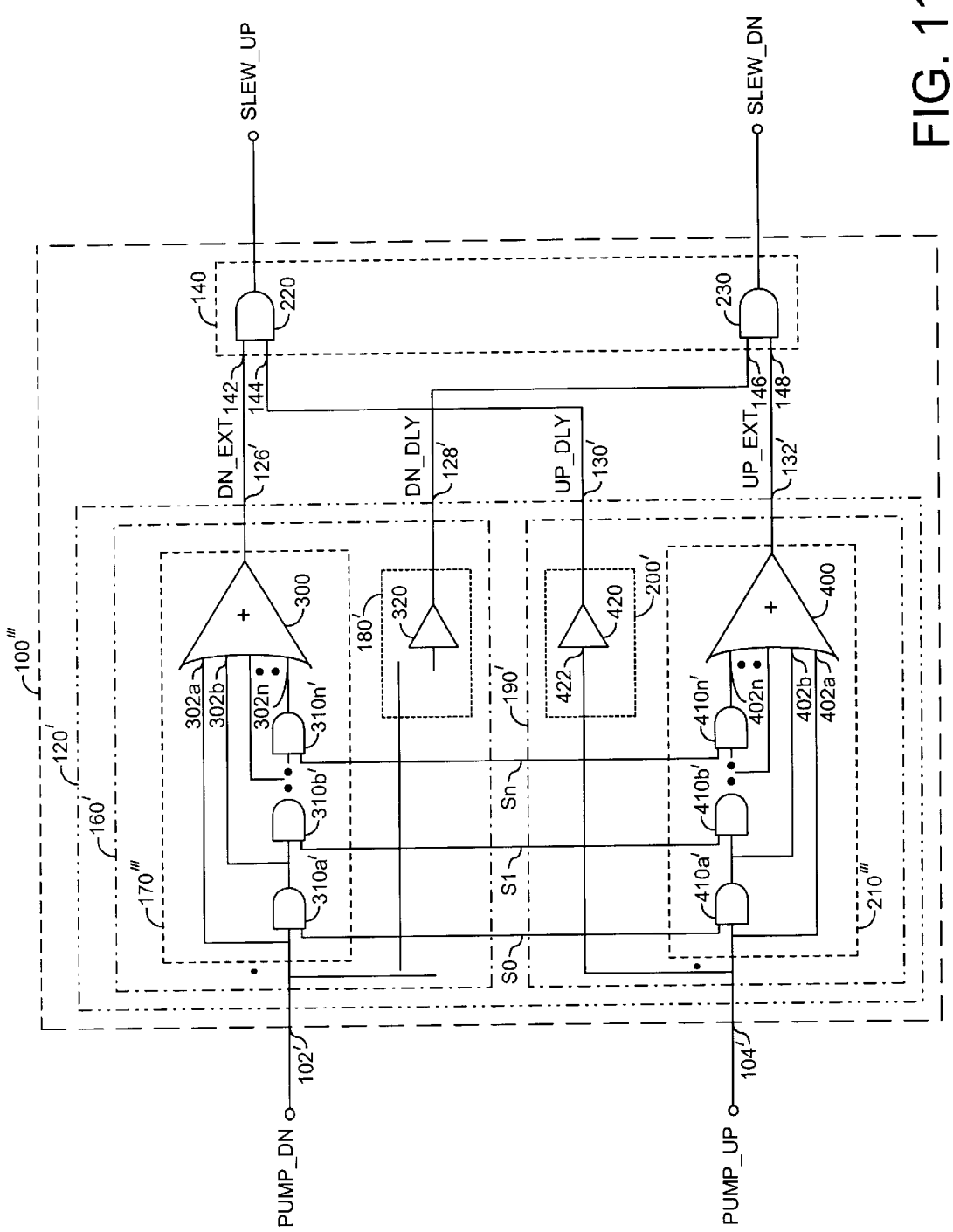
FIG. 11 is a detailed diagram illustrating components of another alternative implementation.

Referring to FIG. 11, a circuit diagram of a circuit 100''' illustrating an alternative implementation is shown. The circuit 100''' operates similarly to the circuit 100' except that the amount of pulse extension may be programmed by a plurality of control signals (e.g., S0–Sn). The plurality of control signals S0–Sn may be external signals. The circuit 100''' is generally connected similarly to the circuit 100. The circuit 170''' may comprise a plurality of two-input AND gates 310a'–310n' and the circuit 210''' may comprise a plurality of two-input AND gates 410a'–410n'.

The plurality of gates 310a'–310n' are generally connected serially with an output of one gate being connected to a first input of the next gate. The signal PUMP_DN is generally presented to a first input of the gate 310a'. Each output of the plurality of gates 310a'–310n' is connected to a different input of the gate 300. A second input of each of the plurality of gates 310a'–310n' may be configured to receive a different one of the plurality of control signals S0–Sn, respectively. The plurality of gates 410a'–410n' are generally connected similarly to the gates 310a'–310n'.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate (i) a first signal in response to a width of a pump down signal pulse, (ii) a second signal in response to a delay of said pump down signal, (iii) a third signal in response to a width of a pump up signal pulse, and (iv) a fourth signal in response to a delay of said pump up signal; and
   a second circuit configured to generate (a) a first control signal in response to (i) said first signal and (ii) said third signal and (b) a second control signal in response to (i) said second signal and (ii) said fourth signal.

2. The apparatus according to claim 1, wherein said first circuit comprises a pulse timing circuit.

3. The apparatus according to claim 1, wherein said second circuit comprises a pulse width comparator circuit.

4. The apparatus according to claim 1, wherein said first circuit comprises (i) a first pulse extender circuit and (ii) a second pulse extender circuit.

5. The apparatus according to claim 4, wherein:
   said first pulse extender circuit is configured to generate (i) said first signal and (ii) said second signal in response to said pump down signal; and
   said second pulse extender circuit is configured to generate (i) said third signal and (ii) said fourth signal in response to said pump up signal.

6. The apparatus according to claim 4, wherein said first circuit further comprises:
   a first delay matching circuit; and
   a second delay matching circuit.

7. The apparatus according to claim 6, wherein:
   said first pulse extender circuit is configured to generate (i) said first signal and (ii) a delayed pump down signal in response to said pump down signal;
   said first delay matching circuit is configured to generate said second signal in response to said delayed pump down signal;
   said second pulse extender circuit is configured to generate (i) said fourth signal and (ii) a delayed pump up signal in response to said pump up signal; and
   said second delay matching circuit is configured to generate said third signal in response to said delayed pump up signal.

8. The apparatus according to claim 6, wherein:
   said first pulse extender circuit is configured to generate (i) said first signal and (ii) a delayed pump down signal in response to (i)said pump down signal and (ii) a plurality of control signals;
   said first delay matching circuit is configured to generate said second signal in response to said delayed pump down signal;
   said second pulse extender circuit is configured to generate (i) said fourth signal and (ii) a delayed pump up signal in response to (i) said pump up signal and (ii) said plurality of control signals; and
   said second delay matching circuit is configured to generate said third signal in response to said delayed pump up signal.

9. The apparatus according to claim 4, wherein:
   said first pulse extender circuit comprises a plurality of gates connected in series and a gate having a plurality of inputs configured to receive (i) said pump down signal and (ii) a plurality of signals from said plurality of gates; and
   said second pulse extender circuit comprises a plurality of gates connected in series and a gate having a plurality of inputs configured to receive (i) said pump up signal and (ii) a plurality of signals from said plurality of gates.

10. The apparatus according to claim 1, wherein said pump down signal and said pump up signal are received from a phase frequency detector.

11. The apparatus according to claim 1, wherein said apparatus comprises a pulse width limiting circuit.

12. The apparatus according to claim 1, wherein said apparatus is part of a phase lock loop.

13. An apparatus comprising:
   means for generating (i) a first signal in response to a width of a pump down signal pulse, (ii) a second signal in response to a delay of said pump down signal, (iii) a third signal in response to a width of a Dump up signal pulse, and (iv) a fourth signal in response to a delay of said pump up signal; and
   means for generating (a) a first control signal in response to (i) said first signal, (ii) said third signal and (b) a second control signal in response to (i) said second signal and (ii) said fourth signal.

14. The apparatus according to claim 13, further comprising:
   means for controlling said signal generating means in response to a plurality of control signals.

15. A method for controlling pulse width in a phase and/or frequency detector comprising the steps of:
   (A) generating (i) a first signal in response to a width of a pump down signal pulse, (ii) a second signal in response to a delay of said pump down signal, (iii) a third signal in response to a width of a pump up signal pulse, and (iv) a fourth signal in response to a delay of said pump up signal; and
   (B) generating (a) a first control signal in response to (i) said first signal, (ii) said third signal and (b) a second control signal in response to (i) said second signal and (ii) said fourth signal.

16. The method according to claim 15, wherein step (A) further comprises the sub-steps of:
   (A-1) generating said first intermediate signal by extending the pulse width of said pump down signal;
   (A-2) generating said second intermediate signal by delaying said pump down signal by an amount of time equivalent to the pulse width extension of step (A-1);
   (A-3) generating said fourth intermediate signal by extending the pulse width of said pump up signal; and
   (A-4) generating said third intermediate signal by delaying said pump up signal by an amount of time equivalent to the pulse width extension of step (A-3).

17. The method according to claim 15, wherein the step (A) further comprises the sub-steps of:

(A-1) generating said first intermediate signal by extending the pulse width of said pump down signal;

(A-2) generating said second intermediate signal by delaying said pump down signal by an amount of time less than the pulse width extension of step (A-1);

(A-3) generating said fourth intermediate signal by extending the pulse width of said pump up signal; and (A-4) generating said third intermediate signal by delaying said pump up signal by an amount of time less than the pulse width extension of step (A-3).

18. The method according to claim 15, wherein step (B) further comprises the sub-steps of:

(B-1) comparing said first intermediate signal to said third intermediate signal;

(B-2) generating said first control signal in response to the shorter of the signals compared in step (B-1);

(B-3) comparing said second intermediate signal to said fourth intermediate signal; and (B-4) generating said second control signal in response to the shorter of the signals compared in step (B-3).

19. The apparatus according to claim 1, wherein said second circuit comprises:

a first pulse width comparator circuit configured to generate said first control signal; and a second pulse width comparator circuit configured to generate said second control signal.

20. The apparatus according to claim 19, wherein said first pulse width comparator circuit and said second pulse width comparator circuit comprise an AND gate.

\* \* \* \* \*